(12) United States Patent
Hsieh et al.

(10) Patent No.: US 6,930,883 B2
(45) Date of Patent: Aug. 16, 2005

(54) HEAT-DISPERSING MODULE OF ELECTRONIC DEVICE

(75) Inventors: Hung Chang Hsieh, Taoyuan Hsien (TW); Chih-Chi Wu, Taoyuan Hsien (TW); Jui-Yuan Hsu, Taoyuan Hsien (TW); Chih-Jen Chen, Taoyuan Hsien (TW); Min-Kuang Chang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 10/691,647

(22) Filed: Oct. 24, 2003

(65) Prior Publication Data

US 2004/0252457 A1 Dec. 16, 2004

(30) Foreign Application Priority Data

Jun. 13, 2003 (TW) ........................................ 92116195 A

(51) Int. Cl.[7] ................................................ H05K 7/20
(52) U.S. Cl. ........................ 361/695; 165/80.3; 454/184
(58) Field of Search ........................ 361/688, 690–697, 361/704, 719, 720; 174/16.1, 16.3, 252; 165/80.3, 104.33, 122

(56) References Cited

U.S. PATENT DOCUMENTS

| | | | | |
|---|---|---|---|---|
| 5,170,336 A | * | 12/1992 | Getter et al. ................. | 363/141 |
| 5,502,618 A | * | 3/1996 | Chiou ......................... | 361/695 |
| 5,945,746 A | * | 8/1999 | Tracewell et al. ............ | 307/43 |
| 5,978,217 A | * | 11/1999 | Kerrigan et al. ............ | 361/694 |
| 6,046,921 A | * | 4/2000 | Tracewell et al. .......... | 363/141 |
| 6,219,234 B1 | * | 4/2001 | Sammakia et al. ......... | 361/695 |
| 6,621,700 B1 | * | 9/2003 | Roman et al. ............... | 361/697 |
| 6,728,104 B1 | * | 4/2004 | Ahmad et al. .............. | 361/704 |
| 6,735,078 B2 | * | 5/2004 | Tsai ........................... | 361/695 |

* cited by examiner

Primary Examiner—Boris Chervinsky
(74) Attorney, Agent, or Firm—Bacon & Thomas, PLLC

(57) ABSTRACT

A heat-dispersing module of an electronic device is disclosed. The heat-dispersing module includes: a housing having a top surface, a bottom surface, a first side surface and a second side surface, wherein the first side surface is opposite to the second side surface; a heat-dispersing fan mounted on the first side surface of the housing; a first vent area disposed on the second side surface of the housing; a second vent area disposed on the top surface of the housing; and a printed circuit board positioned in the housing, thereby a first airflow channel is formed between the top surface of the housing and the printed circuit board and a second airflow channel is formed between the bottom surface of the housing and the printed circuit board, wherein the printed circuit board produces a relatively higher heat at the second airflow channel than the first airflow channel and a distance of the second airflow channel from the printed circuit board to the bottom surface is relatively larger than that of the first airflow channel from the printed circuit board to the top surface.

20 Claims, 7 Drawing Sheets

HEAT-DISPERSING MODULE OF ELECTRONIC DEVICE

FIELD OF THE INVENTION

This invention relates to a heat-dispersing module of an electronic device, and more particularly to a heat-dispersing module of a power supply.

BACKGROUND OF THE INVENTION

Power supply is a necessary basic equipment for operating various electric equipment or information products. Because of the requirement of miniaturization of various electric equipments or information products, small volume and high power have been a design consideration in the development of the power supply. In addition to the design consideration, another key point of the power supply is about heat-dispersing. There are many electronic elements positioned in the power supply, and thus when all these electronic elements are operated, a lot of heat will be produced. However, if the produced heat cannot be effectively removed, the temperature within the housing of the power supply will become higher and higher and result in influencing the efficiency of the power supply and the life of the electronic elements.

Please refer to FIG. 1, which is a sectional drawing showing the structure of the heat-dispersing module of the traditional power supply. Take a power supply with ATX (Advanced Technology expanding) standard as an example. The power supply includes a housing 11, a heat-dispersing fan 12, a printed circuit board 13, a plurality of electronic elements 14 and one or more heat sinks 15. The heat-dispersing fan 12 is mounted in the housing 11 for blowing the hot air out of the housing 11 through a vent area (not shown) when the power supply is operating or attracting the air from outside of the housing 11. In addition, the printed circuit board 13 has a first surface 131 and a second surface 132, wherein on the first surface 131, there are many electronic elements 14 mounted thereon. Because most of the electronic elements 14 will produce heat when operating in the power supply, they become the main heat sources of the power supply. However, the printed circuit board 13 is directly fixed on the bottom surface of the housing 11, and the second surface 132 of the printed circuit board 13 is only about 8.5 mm away from the bottom surface of the housing 11.

For solving this problem, there always includes one or more heat sinks 15 mounted on the first surface 131 of the printed circuit board 13, wherein the location of the heat sink 15 is preferably to contact the electronic elements 14 radiating large amount of heat. The heat sink 15 can conduct the heat generated by the operating electronic elements 14 to the inner space inside the housing 11 for being blown out by the airflow driven by the fan 12 so as to achieve the heat-dispersing efficiency.

Please refer to FIG. 2, which is a schematic view showing the structure of the housing of the power supply with ATX standard in the prior art. As shown in FIG. 2, the housing 11 of the power supply has six surfaces, wherein the top surface 111 is opposite to the bottom surface 112 and a first side surface 113 is opposite to a second side surface 114. The housing 11 further includes a meshed portion 115, one or more first vent areas 116 and one or more second vent areas 117, wherein the meshed portion 115 is formed on the first side surface 113 of the housing 11, the first vent area 116 is formed on the second side surface 114 of the housing 11 and the second vent area 117 is formed on the top surface 111 of the housing 11 and opposite to the first surface 131 (not shown) of the printed circuit board 13. Furthermore, the heat-dispersing fan 12 is mounted next to the meshed portion 115 and attracts the airflow from the first and second vent areas 116, 117 through the operation thereof so as to maintain the air requirement for the system (not shown) and produce an efficient airflow for dispersing the heat inside the power supply.

However, it still has a problem of unable to increase the heat-dispersing efficiency for the traditional power supply. Please refer to FIG. 3, which is a schematic view showing the flowing direction of the airflow as the power supply with ATX standard is operating. When the power supply with ATX standard is positioned in the system (not shown) and operating, an effective airflow Q1 passing through the first vent area 116 is generally employed to disperse the heat produced at the heat source inside the power supply, and because the second vent area 117 is close to the system processor, another airflow Q2 is employed to maintain the air requirement of the system. But, within the traditional power supply with ATX standard, because the effective airflow Q1 passing through the first vent area 116 will be influenced by the airflow Q2 passing through the second vent area 117, the amount of the first effective airflow Q1 is difficult to increase so that the whole heat-dispersing efficiency of the power supply will further be influenced.

Therefore, how to overcome the defects described above and develop a power supply having a better heat-dispersing efficiency is really a priority for the industry.

SUMMARY OF THE INVENTION

The main object of the present invention is to provide a heat-dispersing module for an electronic device, which can raise an amount of an effective airflow and increase a heat-dispersing area so as to improve a heat-dispersing efficiency of the electronic device through a design of heat-dispersing channel and/or a heat conducting plate.

According to an aspect of the present invention, a heat-dispersing module of an electronic device includes: a housing having a top surface, a bottom surface, a first side surface and a second side surface, wherein the first side surface is opposite to the second side surface; a heat-dispersing fan mounted on the first side surface of the housing; a first vent area disposed on the second side surface of the housing; a second vent area disposed on the top surface of the housing; and a printed circuit board positioned in the housing, thereby a first airflow channel is formed between the top surface of the housing and the printed circuit board and a second airflow channel is formed between the bottom surface of the housing and the printed circuit board, wherein the printed circuit board produces a relatively higher heat at the second airflow channel than the first airflow channel and a distance of the second airflow channel from the printed circuit board to the bottom surface is relatively larger than that of the first airflow channel from the printed circuit board to the top surface.

Preferably, the electronic device is a power supply.

Preferably, the first side surface of the housing comprises a meshed portion.

Preferably, the heat-dispersing fan is positioned next to the mashed portion.

Preferably, the printed circuit board comprises a first surface and a second surface, the first surface is located within the second airflow channel, and a number of electronic elements located on the first surface is relatively larger than that on the second surface.

Preferably, the device further includes at least a heat conducting plate, wherein the heat conducting plate conducts the heat produced by the printed circuit board to the bottom surface of the housing.

Preferably, one end of the heat conducting plate is fixed on the first surface of the printed circuit board and the other end is contacted with the bottom surface of the housing, wherein the heat conducting plate is preferably fixed on the bottom surface of the housing via a screw.

Preferably, one end of the heat conducting plate is fixed on the first surface of the printed circuit board, and the heat diverted by the heat conducting plate is conducted through a conducting medium between the other end of the heat conducting plate and the bottom surface of the housing.

Preferably, the heat-dispersing module of the electronic device further includes at least a heat sink fixed on the first surface of the printed circuit board.

Preferably, a distance between the printed circuit board and the top surface of the housing is ranged from 10 to 50 mm.

In accordance with an aspect of the present invention, a heat-dispersing module of an electronic device includes: a housing having a top surface, a bottom surface, a first side surface and a second side surface, wherein the first side surface is opposite to the second side surface; a heat-dispersing fan mounted on the first side surface of the housing; a first vent area disposed on the second side surface of the housing; a second vent area disposed on the top surface of the housing; a printed circuit board positioned in the housing, thereby a first airflow channel is formed between the top surface of the housing and the printed circuit board and a second airflow channel is formed between the bottom surface of the housing and the printed circuit board, wherein the printed circuit board produces a relatively higher heat at the second airflow channel than the first airflow channel, and at least a heat conducting plate located within the second airflow channel for conducting the heat produced by the printed circuit board to the bottom surface of the housing.

Preferably, a distance of the second airflow channel from the printed circuit board to the bottom surface is relatively larger than that of the first airflow channel from the printed circuit board to the top surface.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention is a heat-dispersing module of an electronic device. Although the embodiments hereinafter employ the heat-dispersing module of a power supply for explaining the technique of the present invention, the electronic device that can be used in the present invention is not limited to the power supply only. Any electronic device adaptive to the following technical features is incorporated herein as the reference.

Figure 4:
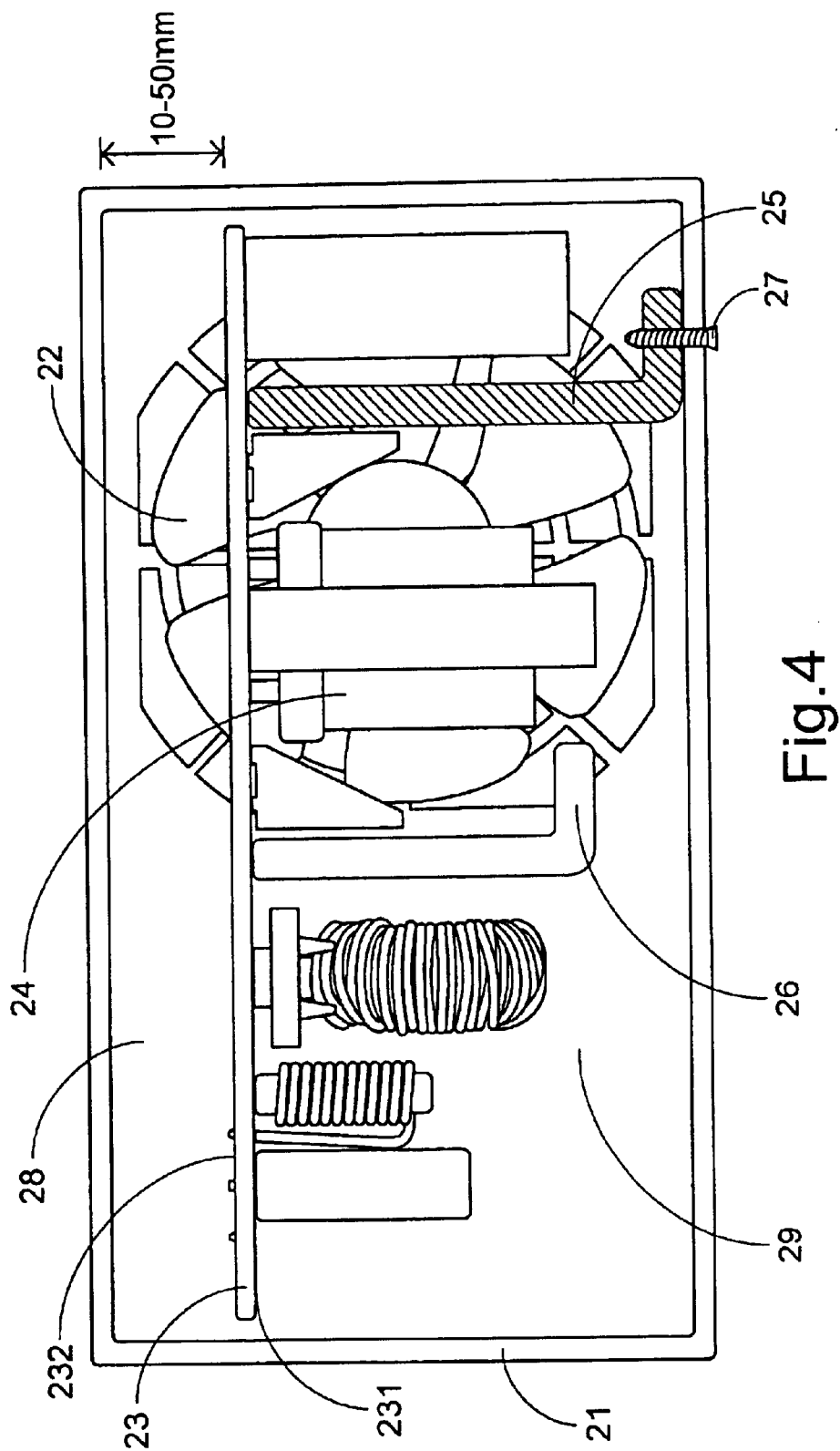
FIG. 4 is a sectional drawing showing a heat-dispersing module of a power supply in a preferred embodiment according to the present invention.

Please refer to FIG. 4, which is a sectional drawing showing a heat-dispersing module of a power supply in a preferred embodiment according to the present invention. Take the power supply with ATX (Advanced Technology expanding) standard for example. The power supply includes a housing 21, a heat-dispersing fan 22, a printed circuit board 23, a plurality of electronic elements 24 and one or more heat conducting plates 25. Among these, the heat-dispersing fan 22 is mounted in the housing 21 for blowing the hot air out of the housing 21 through a vent area (not shown) when the power supply is operating or attracting the external cold air from outside of the housing 11 for dispersing the heat inside.

Figure 5:
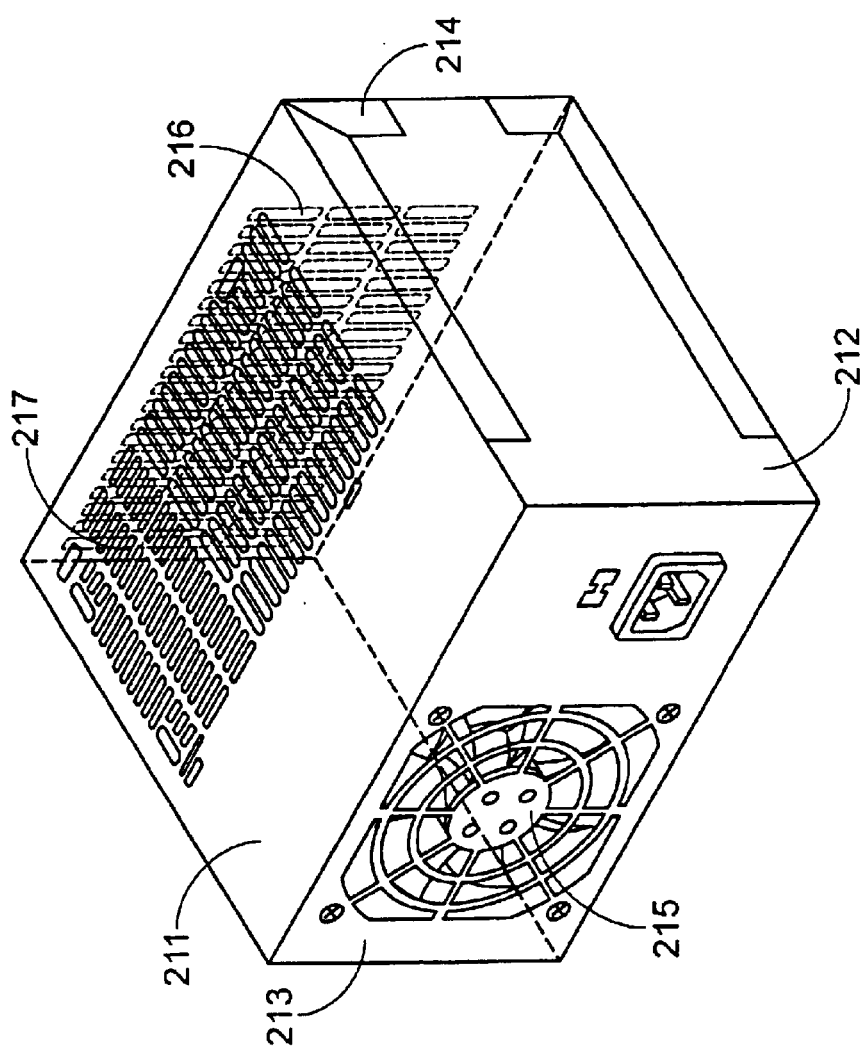
FIG. 5 is a schematic view showing a housing of the power supply in FIG. 4.

Please refer to FIG. 5, which is a schematic view showing the housing of the power supply in FIG. 4. As shown in FIG. 5, the housing 21 of the power supply has six surfaces, wherein a top surface 211 is opposite to a bottom surface 212 and a first side surface 213 is opposite to a second side surface 214. The housing 21 further includes a meshed portion 215, one or more first vent areas 216 and one or more second vent areas 217, wherein the meshed portion 215 is formed on the first side surface 213 of the housing 21, the first vent area 216 is formed on the second side surface 214 of the housing 21 and the second vent area 217 is formed on the top surface 211 of the housing 21. Furthermore, the heat-dispersing fan 22 is mounted next to the meshed portion 215 so that an airflow can be attracted through the first and second vent areas 216, 217 and exhausted through the meshed portion 215 by means of the operation thereof for dispersing the heat inside the power supply. housing 21. Furthermore, the heat-dispersing fan 22 is mounted above the meshed 215 so that an airflow can be extracted through the first and second vent areas 216, 217 and exhausted through the meshed portion 215 by mean of the operation thereof for dispersing the heat inside the power supply.

Please further refer to FIGS. 4 and 5. The printed circuit board 23 can be mounted on a specific position within the housing 21 for forming a first airflow channel 28 between the top surface 211 of the housing 21 and the printed circuit board 23 and forming a second airflow channel 29 between the bottom surface 212 of the housing 21 and the printed circuit board 23, wherein the printed circuit board 23 produces a higher heat at the second airflow channel 29 than the first airflow channel 28, and a distance of the second airflow channel 29 from the printed circuit board 23 to the bottom surface 212 is larger than that of the first airflow channel 28 from the printed circuit board 23 to the top surface 211.

The printed circuit board 23 has a first surface 231 and a second surface 232, wherein the first surface 231 is located within the second airflow channel 29, and a number of the electronic elements 24 located on the first surface 231 is significantly larger than that on the second surface 232. In this embodiment, the distance between the printed circuit board 23 and the top surface 211 of the housing 23 is preferably ranged from 10 to 50 mm.

Figure 1:
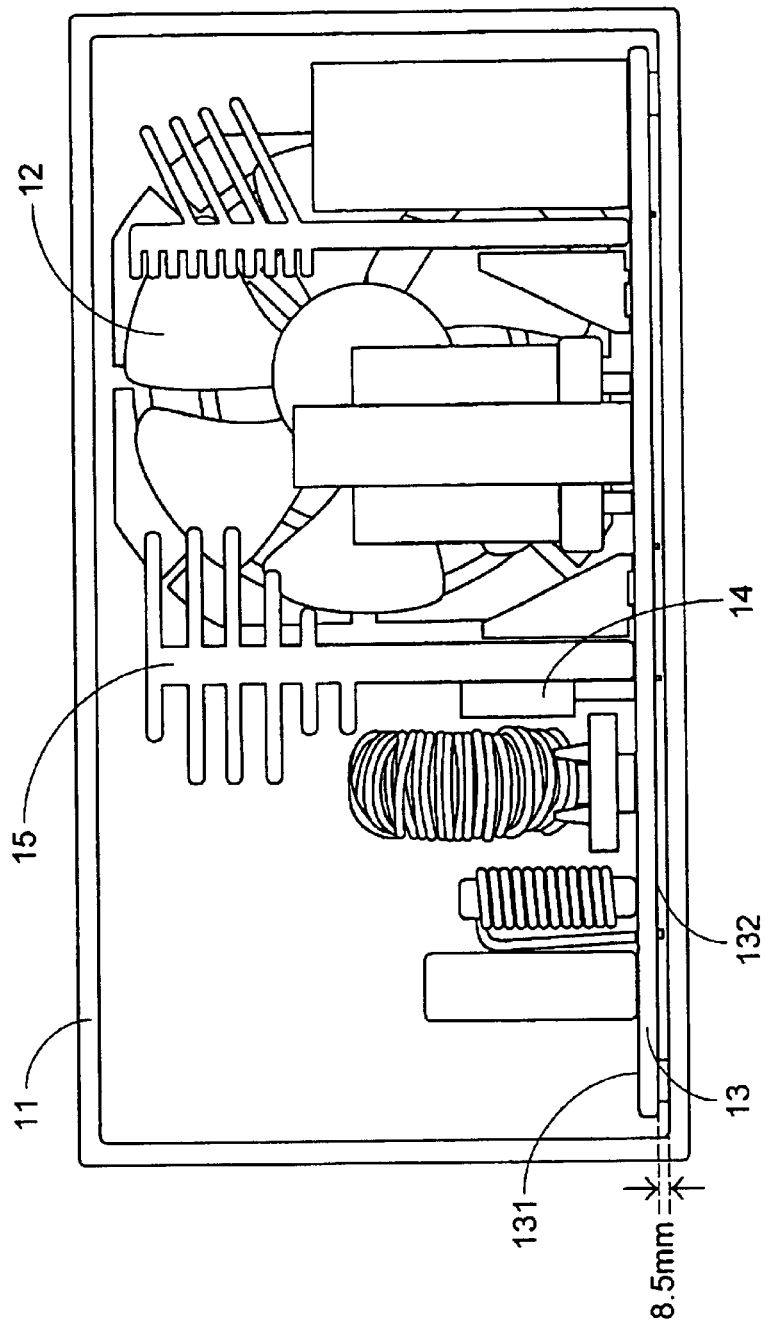
FIG. 1 is a sectional drawing showing a heat-dispersing module of a traditional power supply.
Figure 2:
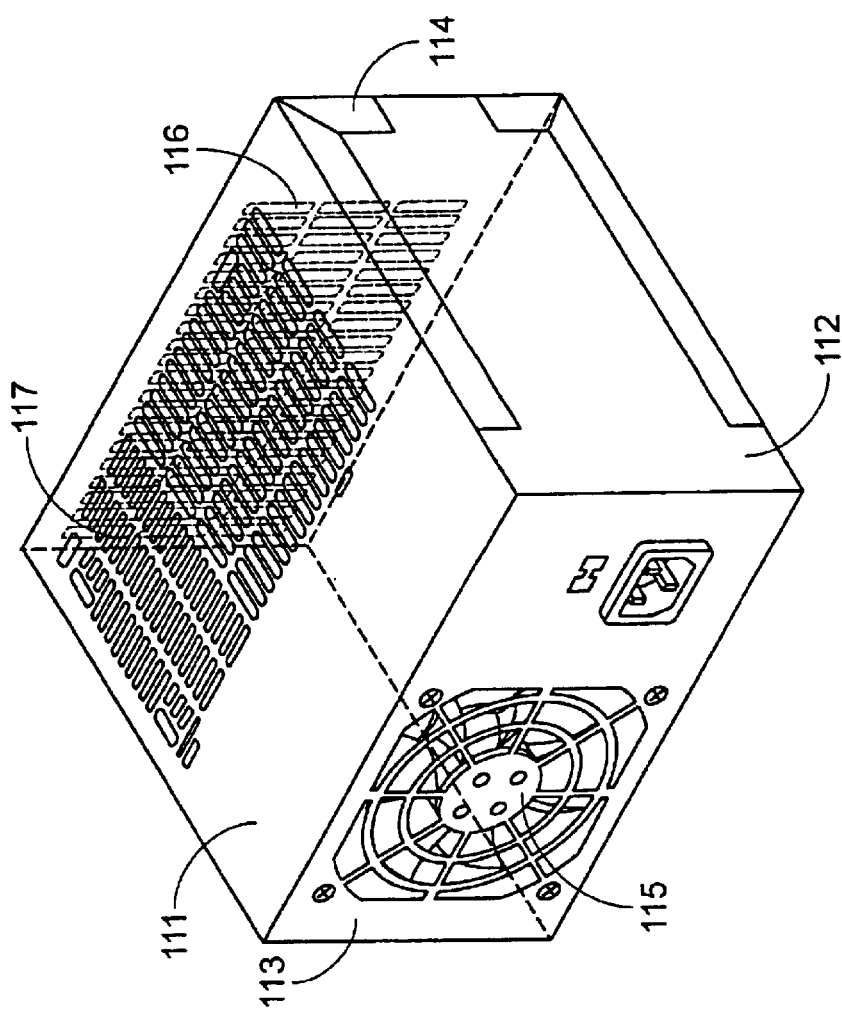
FIG. 2 is a schematic view showing a housing of the power supply in FIG. 1.
Figure 3:
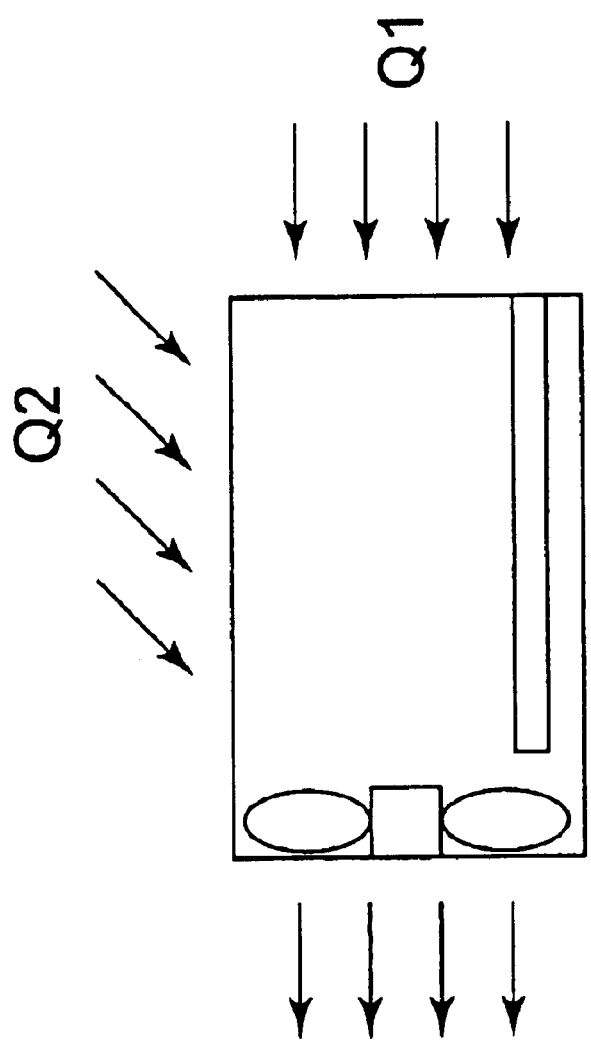
FIG. 3 is a schematic view showing the airflow channels when the power supply in FIG. 1 is under operation.
Figure 6:
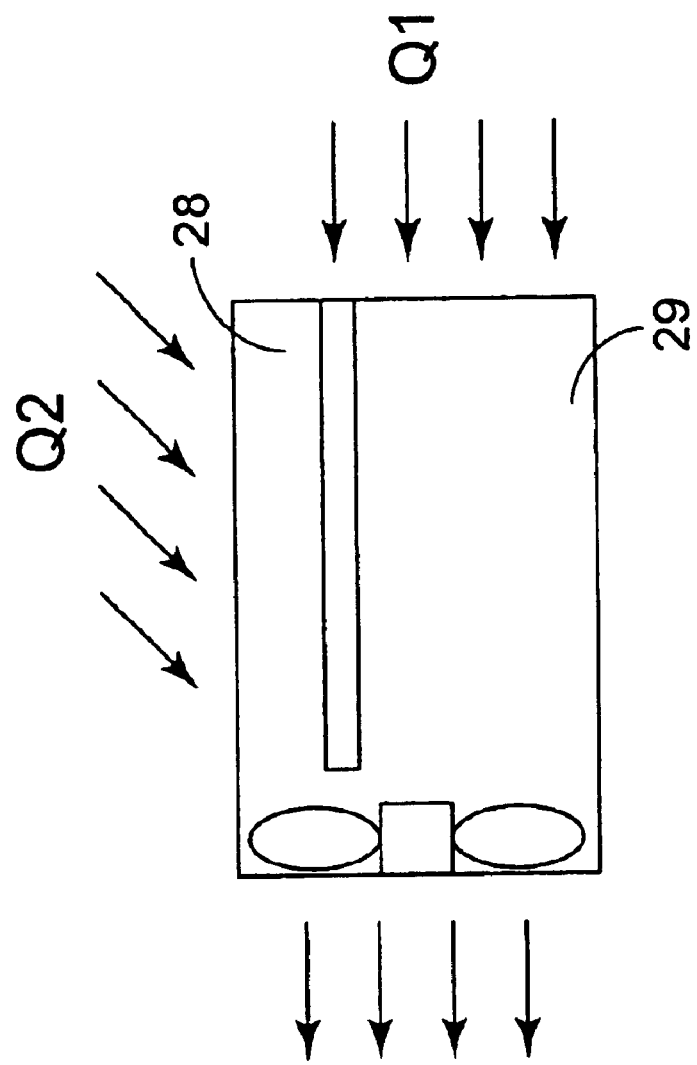
FIG. 6 is a schematic view showing the airflow channels when the power supply in FIG. 4 is under operation.

Please refer to FIG. 6, which is a schematic view showing the airflow channels when the power supply in FIG. 4 is under operation. The first airflow channel 28 has a sufficient airflow Q2 passing through the second vent area 217 for maintaining the airflow requirement for the system (not shown). As to the second airflow channel 29, it is mainly the heat source region of the power supply. Because the second airflow channel 29 is formed and an effective airflow Q1 passing through the first vent area 216 is no longer influenced by the airflow Q2 passing through the second vent area 217, more effective airflows can be generated to pass the heat source region for further increasing a whole heat-dispersing efficiency of the power supply. As comparing the structure in FIG. 3 with that in FIG. 6, under the same external conditions, the effective airflow Q1 produced in the prior art is approximately 9.3 cfm and the effective airflow Q1 produced in the present invention is approximately 11.5 cfm. Therefore, it can be obviously seen that the technique of the present invention can increase about 23.6% of the effective airflow so that the whole heat-dispersing efficiency can be further improved.

Figure 7:
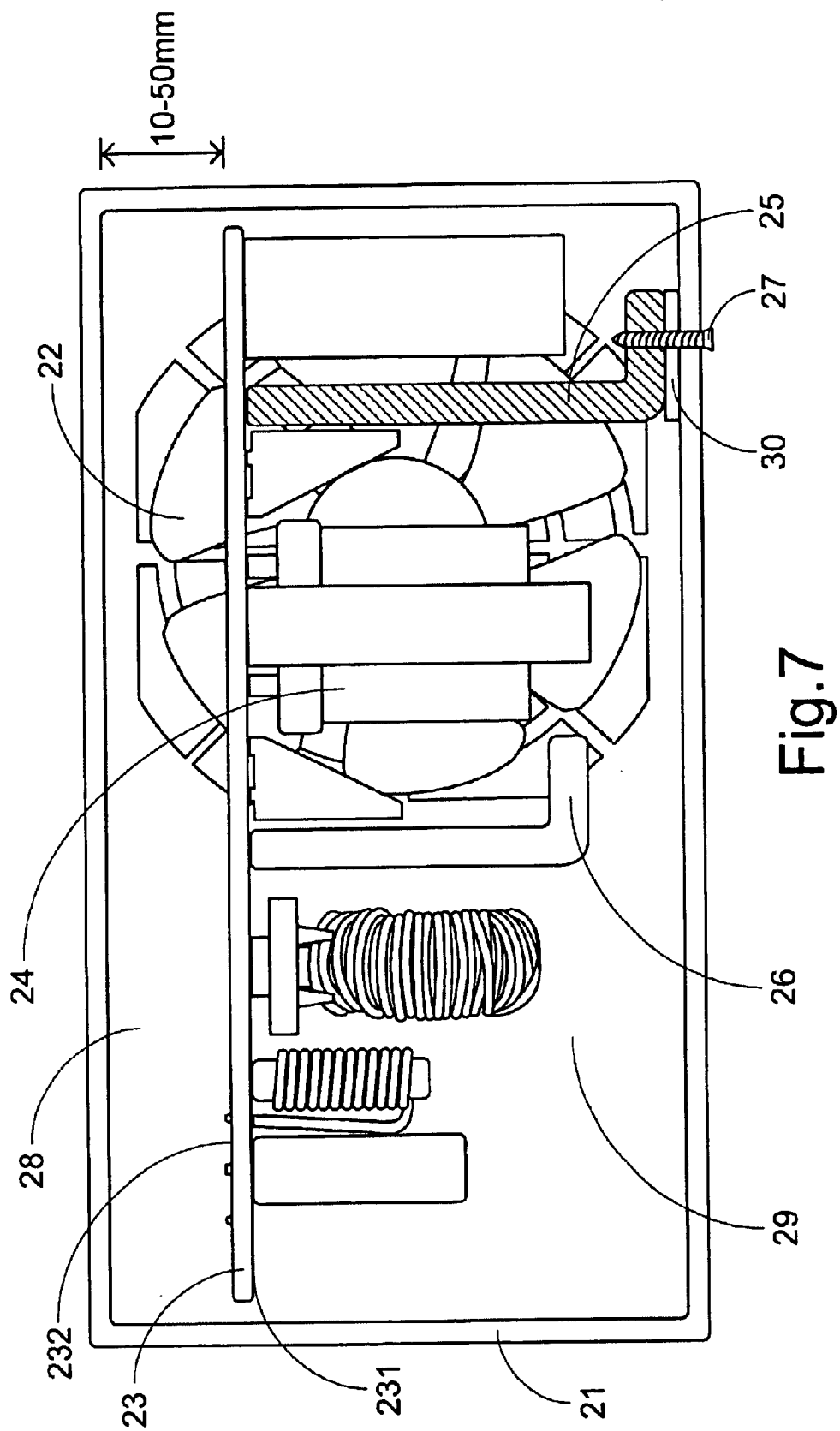
FIG. 7 is a sectional drawing showing a heat-dispersing module of a power supply in another preferred embodiment according to the present invention.

In addition, please further refer to FIG. 4. For conducting the heat produced by the electronic element 24 on the first surface 231 of the printed circuit board 23, the first surface 231 of the printed circuit board 23 can further set one or more heat conducting plates 25. The main function of the heat conducting plate 25 is to conduct the heat produced by the printed circuit board 23 to the bottom surface 212 of the housing 21 for increasing the heat-dispersing area. Moreover, one end of the heat conducting plate 25 can be fixed on the first surface 231 of the printed circuit board 23 and contact with the electronic element 24 radiating larger amount of heat. The other end of the heat conducting plate 25 is contacted with the bottom surface 212 of the housing 21 and is fixed through a screw 27. Certainly, the heat at the heat conducting plate 25 also can be diverted by a conducting medium 30 (as shown in FIG. 7) located between the other end of the heat conducting plate 25 and the bottom surface 212 of the housing 21 without directly contacting the bottom surface 212. Furthermore, the bottom surface 212 can be made of a material different from or identical to other side surfaces such as any metal or a metal with a better conduction coefficient e.g. aluminum or aluminum alloy. Because the heat is diverted through the contact between the other end of the heat conducting plate 25 and the bottom 212 of the housing 21 or through the conducting medium, the heat produced by the electronic elements 24 on the first surface 231 of the printed circuit board 23 can be diverted to the bottom surface 222 of the housing 21 through the heat conducting plate 25. Further, because the bottom surface 212 of the housing 21 has a larger heat-dispersing area, the production of a larger heat-dispersing area for the power supply can be achieved by a lower cast by way of the configuration mentioned above.

Besides, in addition to the heat-dispersing plate, one or more heat sinks 26 also can be selectively mounted on the first surface 231 of the printed circuit board 23, like the prior arts. One end of the heat sink 26 can be fixed on the first surface 231 of the printed circuit board 23, and the other end of the heat sink 26 can be selectively provided with heat-dispersing flanks without contacting with the bottom surface 212 of the housing 21. Because the principle and arrangement of the heat sink 26 are identical to that in the prior art, it will not give unnecessary details here.

In view of aforesaid, the present invention provides a heat-dispersing module of an electronic device which increases the amount of the effective airflow through a specific design of airflow channels so as to improve the whole heat-dispersing efficiency of the electronic device.

Moreover, because two ends of the heat conducting plate are respectively connected to the printed circuit board and the bottom surface of the housing, the heat generated by the electronic device on the first surface of the printed circuit board can be diverted to the bottom surface through the heat conducting plate. Furthermore, since the bottom surface has a larger area for heat dispersing, a larger heat-dispersing area can be produced by a lower cost by way of the configuration according to the present invention. Consequently, the present invention really owns industrial values.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat-dispersing module of an electronic device, comprising:

a housing having a top surface, a bottom surface, a first side surface and a second side surface, wherein said first side surface is opposite to said second side surface;

a heat-dispersing fan mounted on said first side surface of said housing;

a first vent area disposed on said second side surface of said housing;

a second vent area disposed on said top surface of said housing; and a printed circuit board positioned in said housing, thereby a first airflow channel is formed between said top surface of said housing and said printed circuit board, and a second airflow channel is formed between said bottom surface of said housing and said printed circuit board, wherein said printed circuit board produces a relatively higher heat at said second airflow channel than said first airflow channel and a distance of said second airflow channel from said printed circuit board to said bottom surface is relatively larger than that of said first airflow channel from said printed circuit board to said top surface, wherein said second airflow channel has a first airflow passing through said first vent area, said first airflow channel has a second airflow passing through said second vent area, and said first airflow and said second airflow are separated by said printed circuit board so that the first airflow is not influenced by the second airflow.

2. The heat-dispersing module as claimed in claim 1 wherein said electronic device is a power supply.

3. The heat-dispersing module as claimed in claim 1 wherein said first side surface of said housing comprises a meshed portion.

4. The heat-dispersing module as claimed in claim 3 wherein said heat-dispersing fan is positioned next to said mashed portion.

5. The heat-dispersing module as claimed in claim 1 wherein said printed circuit board comprises a first surface and a second surface, said first surface is located within said second airflow channel, and a number of electronic elements located on said first surface is relatively larger than that on said second surface.

6. The heat-dispersing module as claimed in claim 5, further comprising at least a heat conducting plate, wherein said heat conducting plate diverts the heat produced by said printed circuit board to said bottom surface of said housing.

7. The heat-dispersing module as claimed in claim 6 wherein one end of said heat conducting plate is fixed on said first surface of said printed circuit board and the other end is contacted with said bottom surface of said housing.

8. The heat-dispersing module as claimed in claim 7 wherein said heat conducting plate is fixed on said bottom surface of said housing via a screw.

9. The heat-dispersing module as claimed in claim 6 wherein one end of said heat conducting plate is fixed on said first surface of said printed circuit board, and said heat diverted by said heat conducting plate is conducted through a conducting medium between the other end of said heat conducting plate and said bottom surface of said housing.

10. The heat-dispersing module as claimed in claim 5 further comprising at least a heat sink fixed on said first surface of said printed circuit board through one end thereof.

11. The heat-dispersing module as claimed in claim 1 wherein a distance between said printed circuit board and said top surface of said housing is ranged from 10 to 50 mm.

12. A heat-dispersing module of an electronic device, comprising:
   a housing having a top surface, a bottom surface, a first side surface and a second side surface, wherein said first side surface is opposite to said second side surface;
   a heat-dispersing fan mounted on said first side surface of said housing;
   a first vent area disposed on said second side surface of said housing;
   a second vent area disposed on said top surface of said housing;
   a printed circuit board positioned in said housing, thereby a first airflow channel is formed between said top surface of said housing and said printed circuit board, and a second airflow channel is formed between said bottom surface of said housing and said printed circuit board, wherein said printed circuit board produces a relatively higher heat at said second airflow channel than at said first airflow channel; and
   at least a heat conducting plate located within said second airflow channel for diverting a heat produced by said printed circuit board to said bottom surface of said housing,
   wherein said second airflow channel has a first airflow passing through said first vent area, said first airflow channel has a second airflow passing through said second vent area, and said first airflow and said second airflow are separated by said printed circuit board so that the first airflow is not influenced by the second airflow.

13. The heat-dispersing module as claimed in claim 12 wherein said electronic device is a power supply.

14. The heat-dispersing module as claimed in claim 12 wherein said first side surface of said housing comprises a meshed portion.

15. The heat-dispersing module as claimed in claim 14 wherein said heat-dispersing fan is positioned next to said mashed portion.

16. The heat-dispersing module as claimed in claim 12 wherein said printed circuit board comprises a first surface and a second surface, said first surface is located within said second airflow channel, and a number of electronic elements located on said first surface is relatively larger than that on said second surface.

17. The heat-dispersing module as claimed in claim 16 wherein one end of said heat conducting plate is fixed on said first surface of said printed circuit board and the other end is contacted with said bottom surface of said housing.

18. The heat-dispersing module as claimed in claim 17 wherein said heat conducting plate is fixed on said bottom surface of said housing via a screw.

19. The heat-dispersing module as claimed in claim 16 wherein one end of said heat conducting plate is fixed on said first surface of said printed circuit board, and said heat diverted by said heat conducting plate is conducted through a conducting medium between the other end of said heat conducting plate and said bottom surface of said housing.

20. The heat-dispersing module as claimed in claim 12 wherein a distance of said second airflow channel from said printed circuit board to said bottom surface is relatively larger than that of said first airflow channel from said printed circuit board to said top surface.

* * * * *